(12) United States Patent
Matsuoka et al.

(10) Patent No.: US 6,747,316 B2
(45) Date of Patent: *Jun. 8, 2004

(54) SURFACE-CHANNEL METAL-OXIDE SEMICONDUCTOR TRANSISTORS, THEIR COMPLEMENTARY FIELD-EFFECT TRANSISTORS AND METHOD OF PRODUCING THE SAME

(75) Inventors: Toshimasa Matsuoka, Osaka (JP); Seizou Kakimoto, Nara (JP); Shigeki Hayashida, Nara (JP); Hiroshi Iwata, Nara (JP)

(73) Assignee: Sharp Kabushiki Kaisha, Abeno-ku (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/678,394

(22) Filed: Jul. 2, 1996

(65) Prior Publication Data

US 2002/0043689 A1 Apr. 18, 2002

(30) Foreign Application Priority Data

Jul. 3, 1995 (JP) ............................................. 7-167470

(51) Int. Cl.$^7$ ............................................. H01L 29/76
(52) U.S. Cl. ...................... 257/344; 257/372; 257/408; 257/345

(58) Field of Search ................................ 257/369, 371, 257/372, 376, 377, 382, 387, 344, 336, 337, 408, 345

(56) References Cited

U.S. PATENT DOCUMENTS 4,703,551 A * 11/1987 Szluk et al. .................. 437/30
4,729,001 A * 3/1988 Haskell ...................... 357/23.3
5,434,440 A * 7/1995 Yoshitomi et al. .......... 257/344

OTHER PUBLICATIONS

Hori, Taskashi, "A 0.1–um CMOS Technology with TiltImplanted Punchthrough Stopper (TIPS)," IEDM Tech. Digest, pp 75–78 (1994).*

Davari, Bijan, et al. "A High–Performance 0.25–um CMOS Technology: II—Technology," *IEEE Transactions on Electron Devices*, 39(4): 967–975 (1992).

* cited by examiner

Primary Examiner—Ori Nadav
(74) Attorney, Agent, or Firm—Morrison & Foerster LLP

(57) ABSTRACT

A surface-channel MOS transistor comprising; a gate electrode formed on a semiconductor substrate with a gate dielectric film therebetween and source/drain regions formed in the semiconductor substrate wherein the gate electrode is formed at least a polysilicon layer of a thickness of 100 to 200 nm uniformly doped with an impurity and the source/drain regions contains the same impurity in self-alignment with the gate electrode.

4 Claims, 7 Drawing Sheets

"*Prior Art*"

*"Prior Art"*

SURFACE-CHANNEL METAL-OXIDE SEMICONDUCTOR TRANSISTORS, THEIR COMPLEMENTARY FIELD-EFFECT TRANSISTORS AND METHOD OF PRODUCING THE SAME

BACKGROUND OF THE INVENTION

1. Field of the Invention

The present invention relates to surface-channel metal-oxide semiconductor (MOS) transistors, their complementary field-effect transistors (FETs) and methods of producing them. More particularly, a surface-channel PMOS (P-channel metal-oxide semiconductor), surface-channel NMOS (N-channel metal-oxide semiconductor), dual-gate CMOS (complementary metal-oxide-semiconductor) and a method of producing the same are provided.

2. Description of Related Art

In FETs with dielectric gates employed in semiconductor integrated circuits (ICs) now in use, short-channel effects such as a decline in threshold voltage, deterioration in subthreshold characteristics and punchthrough are often seen with microminiaturization of devices since the ratio of a depletion layer charge of a gate electrode becomes smaller to the entire depletion layer charge. PMOSs, in particular, suffer from more considerable short-channel effects than NMOSs.

One reason for such short-channel effects is that boron, which has a large diffusion coefficient and a large implant range, is used as an impurity for forming source/drain regions in a PMOS.

Another reason is that a conventionally used PMOS has a gate electrode formed of the same $N^+$ polysilicon as NMOS and a buried channel for controlling the threshold voltage. In such a construction, since the channel is formed away from the MOS surface, the control of the gate over the inversion charge density becomes weaker and therefore considerable short-channel effects are produced.

For reducing such phenomena, a surface-channel PMOS is constructed to have a $P^+$ polysilicon gate electrode and form a pair with a conventional surface-channel NMOS. Thus the PMOS and NMOS are both of surface-channel type suitable for reducing the short-channel effects.

A CMOS having such surface-channel type NMOS and PMOS (hereafter referred to as dual-gate CMOS) will be explained with reference to figures.

As shown in FIG. 8, a P-well 2 and N-well 3 are formed in a silicon substrate 1. Formed in the P-well 2 is an NMOS transistor including a gate dielectric film 5, an $N^+$ polysilicon gate electrode 16a, a sidewall-spacer 19, silicides 12 and 12a, source/drain regions 20 and LDD (lightly doped drain/source) regions 17. And formed in the N-well 3 is a PMOS transistor including a gate dielectric film 5, an $P^+$ polysilicon gate electrode 16b, a sidewall-spacer 19, silicides 12 and 12a, source/drain-regions 21 and LDD regions 18.

A method of producing the dual-gate CMOS will hereafter be described.

First, as shown in FIG. 6, the P-well 2, the N-well 3 and a field dielectric film 4 are formed on the silicon substrate 1. Then, the gate dielectric film 5 and the intrinsic polysilicon gate electrodes 16 of a thickness of 200 to 300 nm are formed.

Next, as shown in FIG. 7, $N^-$ LDD regions 17 and $P^-$ LDD regions 18 are formed through lithography process and ion implantation, and the sidewall-spacer 19 is formed through a CVD process and anisotropic etching.

Then, as shown in FIG. 8, the $N^+$ source/drain regions 20 and the $P^+$ source/drain regions 21 are formed and the polysilicon gate electrodes 16 are doped through lithography process, ion implantation and activation annealing. Then the suicides 12 and 12a are formed on the source/drain regions and the gate electrodes through sputtering using a refractory metal as a target, selective silicidation and removal of unreacted refractory metal. In the ion implantation for the formation of the $N^+$ source/drain regions 20 and the $P^+$ source/drain regions 21 and for the doping of the polysilicon gate electrodes 16, $^{75}As^+$ and $^{49}BF_2^+$ are usually used so that shallow source/drain regions can be obtained. Through the above-described processes, the dual-gate CMOS is constructed.

Alternatively, in order to reduce the short channel effects in PMOS, an N-type highly doped region 24 of an impurity concentration a little higher than that of a channel region is formed as shown in FIG. 9 after the polysilicon gate 16 is formed as shown in FIG. 6. By the N-type highly doped region 24, the extension of the depletion layer from the source/drain regions is barred and the short channel effects are reduced. Though FIG. 9 illustrates PMOS, a similar technique can be used with NMOS.

In the above-mentioned method of producing a dual-gate CMOS, $^{49}BF_2^+$ whose implant range is small is implanted for the formation of the source/drain regions in PMOS with a view to reducing the short channel effects, and then the activation annealing is carried out.

However, the use of $^{49}BF_2^+$ involves a problem that the shift of flat band voltage becomes significantly larger compared with a case where $^{11}B^+$ is used. FIG. 10 illustrates plotted relations of the flat band voltage to annealing temperature when a furnace annealing or a rapid thermal annealing (RTA) is performed in various temperatures of P-substrates with gate dielectric films (the film thickness being 5 nm) and intrinsic polysilicon gate electrodes doped with $^{49}BF_2^+$ or $^{11}B^+$. When the furnace annealing is carried out at 900° C. for 30 minutes after the ion implantation with $^{49}BF_2^+$ (denoted by ● in FIG. 10), the flat band voltage shifts significantly. This shift of the flat band voltage indicates that boron atoms penetrate into the silicon substrate from the polysilicon gate electrode via the gate dielectric film with the furnace annealing. It is remarked that this phenomenon not only changes the flat band voltage but also leads to a decrease in dielectric immunity.

For reducing the above-mentioned shift of the flat band voltage, RTA such as lamp annealing is employed. Referring to FIG. 10, when RTA is carried out, the flat band voltage does not shift in either case with $^{49}BF_2^+$ or $^{11}B^+$. However, RTA is not sufficient for activating the source/drain regions and reducing junction leakage, and cannot provide the same characteristics to the semiconductor as the furnace annealing provides.

Alternatively, a nitrided oxide film is used as the gate dielectric film. However, when the nitrided oxide film is formed by the use of $NH_3$, a number of electron traps are produced by hydrogen atoms and the reliability of the device is disadvantageously lowered. When $N_2O$ is used for the nitrided oxide film, fewer electron traps are produced, but the number of nitrogen atoms which are effective against the penetration of boron atoms is smaller compared with the nitrided oxide film obtained by using $NH_3$, so that the penetration of boron atoms into the silicon substrate can hardly be prevented.

Considering the reliability of the device, it is questionable to use $^{49}BF_2^+$.

Moreover $^{49}BF_2^+$ adversely affects not only the characteristics of MOS but also a silicided diffusion layer. FIG. 11 shows the relation of sheet resistance to an implant dose in the source/drain regions where $TiSi_2$ is formed. When $^{49}BF_2^+$ is used, the sheet resistance significantly increases at high doses compared with the $^{11}B^+$. This is not desirable because it increases parasitic resistance in PMOS.

In the above method of forming a dual-gate CMOS, there is another remark. Since the polysilicon gate electrode is doped by ion-implantation, the profile of the impurity in the polysilicon gate electrode (film thickness referred to as $T_{POLY}$) is like the Gaussian distribution. Therefore, the condition represented by the following formula must be satisfied:

$$Rp+3\Delta Rp < T_{POLY}\ (Rp:\text{ implant range}, \Delta Rp:\text{ implant diffusion})$$

When the impurity is not diffused well by annealing, the concentration of the impurity does not reach $10^{20}$ cm$^{-3}$ near the interface of the polysilicon gate electrode with the gate dielectric film. This is well marked when the impurity is implanted with low energy for providing shallow source/drain regions. In such a case, since a depletion layer is produced near the interface of the polysilicon gate electrode with the gate dielectric film in a strong inversion state of a field-effect transistor, the controllability of the gate becomes weak, the short-channel effects increases, transconductance decreases, and subthreshold characteristics deteriorate. Such problems are most remarkable when the polysilicon gate electrode of NMOS is doped with As.

Therefore, although it is preferable to make the gate electrode thinner, when $P^+$ polysilicon gate electrode in CMOS with PMOS and NMOS formed on a substrate is implanted with $^{11}B^+$, boron can be doped in a concentration of $10^{16}$ cm$^{-3}$ or more into the gate dielectric film and a channel region directly under the gate dielectric film due to profile tail by channeling or the like, so that possibly a fixed charge is generated in the gate dielectric film or the concentration of the impurity in the channel is caused to change. Particularly, the above phenomenon is remarkable when the crystal structure of polysilicon gate electrode is columner. Therefore, it is difficult to make the gate electrode a thin film.

Further, although the N-type highly concentrated region 24 formed as shown in FIG. 9 reduces the extension of the depletion layer from the source/drain regions so that the short-channel effects can be reduced, the transfer conductance and subthreshold characteristics deteriorate since the impurity concentration rises near the LDD end of the channel region. Additionally, it is difficult to reduce the junction leakage and junction capacitance of periphery.

SUMMARY OF THE INVENTION

The present invention provides a surface-channel MOS transistor comprising; a gate electrode formed on a semiconductor substrate with a gate dielectric film therebetween and source/drain regions formed in the semiconductor substrate wherein the gate electrode is formed at least a polysilicon layer of a thickness of 100 to 200 nm uniformly doped with an impurity and the source/drain regions contains the same impurity in self-alignment with the gate electrode.

Further, the present invention provides a complementary FET in which a PMOS FET and NMOS FET both having the above construction are formed on the same semiconductor substrate.

Still further, the present invention provides a method of producing a surface-channel MOS transistor comprising the steps of; (i) forming a gate dielectric film on a semiconductor substrate and depositing an intrinsic polysilicon layer of a thickness of 100 to 200 nm on the gate dielectric film, followed by patterning into a desired configuration to form a gate electrode; and (ii) doping the gate electrode with an impurity by implanting an impurity from the top of the gate electrode while simultaneously source/drain regions are formed in self-alignment with the gate electrode.

According to the present invention, it provides a surface-channel PMOS having reliable device characteristics wherein the short-channel effects are reduced, an NMOS and a complementary field-effect transistor having good device characteristics wherein the generation of a depletion layer is inhibited near the interface of the gate electrode with the gate dielectric film, and a method of producing the same. In the formation of such a transistor, a relatively thin polysilicon layer can be used both in NMOS and PMOS for the gate electrode, and $^{11}B^+$ instead of $^{49}BF_2^+$ may be used for the formation of source/drain regions and the doping of a gate electrode in PMOS.

DESCRIPTION OF THE PREFERRED EMBODIMENTS

Figure 1:
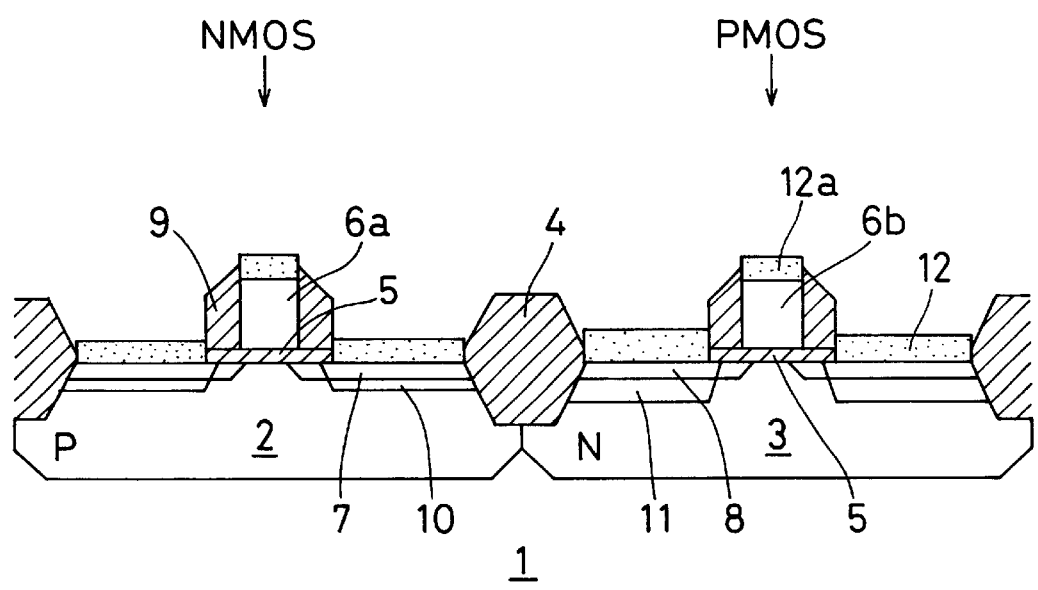
FIG. 1 is a schematic sectional view illustrating the essential part of an embodiment of a CMOS including a surface-channel MOS transistor according to the present invention.

The semiconductor substrate used for the surface-channel MOS transistor according to the present invention is not particularly limited, and a semiconductor substrate conventionally used for a semiconductor IC may be used. For example, a silicon substrate is preferred. The semiconductor substrate is preferably formed with a field oxide film, a trench or the like in order to form an isolating region. For the formation of a surface-channel PMOS or NMOS transistor, the semiconductor substrate is an N- or P-type semiconductor substrate or is formed with at least one N-type region or well, or P-type region or well which contains N- or P-type impurity in a concentration of about $1 \times 10^{16}$ to about $1 \times 10^{18}$ cm$^{-3}$. When such a surface-channel MOS transistor is used for constructing a complementary FET transistor, at least one of the above-mentioned N-type region or well and at least one of the above-mentioned P-type region or well are formed in the same semiconductor substrate.

According to the present invention, formed on a semiconductor substrate is a surface-channel MOS transistor which comprises a gate dielectric film, a gate electrode being made at least of polysilicon and source/drain regions.

As the gate dielectric film, a material which may cause few traps may be used in a thickness of about 15 to 100 Å. Examples of such materials are an oxide film such as $SiO_2$ and a nitrided oxide film of a low nitrogen concentration obtained by using $N_2O$.

The gate electrode is formed by depositing an intrinsic polysilicon to a thickness of about 100 to about 200 nm by a conventional process such as CVD method, patterning it into a desired configuration by photolithography and etching process, and doping it substantially uniformly with an impurity by later-described ion-implantation. For example, in PMOS, the gate electrode is doped with $^{11}B^+$ in a concentration of about $1\times10^{20}$ to about $5\times10^{20}$ $cm^{-3}$ by implantation at a dose of about $1\times10^{15}$ to about $7\times10^{15}$ $cm^{-2}$; and, in NMOS, the gate electrode is doped with $^{75}As^+$ or $^{31}P^+$ in a concentration of about $1\times10^{20}$ to about $5\times10^{20}$ $cm^{-3}$ by implantation at a dose of about $1\times10^{15}$ to about $7\times10^{15}$ $cm^{-2}$. Therefore, the impurity concentration is more than about $1\times10^{20}$ $cm^{-3}$ at the interface of the gate electrode with the gate dielectric film. The gate electrode may be formed only of polysilicon as described above, or alternatively may be formed of polysilicon which is partially or wholly converted into a silicide by depositing a refractory metal such as Co, Ni, Ti, Ta, Mo or W to a thickness of about 10 to 50 nm on it. When the gate electrode is formed by such a silicide, the gate resistance may be inhibited from increasing even though the thickness of the gate electrode itself is relatively thin as described above.

A sidewall-spacer may be formed with $SiO_2$, SiN or the like to a thickness of about 30 to about 200 nm adjacent to the above gate electrode. The sidewall-spacer allows LDD regions to be formed. In both PMOS and NMOS, the impurity concentration in the LDD regions is preferably about $1\times10^{18}$ to about $5\times10^{19}$ $cm^{-3}$.

The source/drain regions are formed in self-alignment with the gate electrode with one of the above-described ions doped into the semiconductor substrate. That is, in PMOS, the source/drain regions are implanted with $^{11}B^+$ at a dose of about $1\times10^{15}$ to about $7\times10^{15}$ $cm^{-2}$; and, in NMOS, it is implanted with $^{75}As^+$ at a dose of about $1\times10^{15}$ to about $7\times10^{15}$ $cm^{-2}$ or with $^{31}P^+$ at a dose of about $1\times10^{15}$ to about $7\times10^{15}$ $cm^{-2}$. In addition, according to the present invention, the source/drain regions may be converted partially or wholly into a silicide by depositing a refractory metal to a thickness of about 10 to about 50 nm as described above on the semiconductor substrate. Thereby the sheet resistance in the source/drain regions may be inhibited from increasing.

Further, the transistor may have, directly under the LDD regions and on the channel side of the source/drain regions, highly doped regions of a different conductivity from that of the source/drain regions, whose impurity concentration is at least higher than that of the substrate (or the well), i.e., the channel region. The highly doped regions in PMOS is preferably doped with $^{75}As^+$ or $^{31}P^+$ in a concentration of $2\times10^{17}$ to $2\times10^{18}$ $cm^{-3}$; and the highly doped regions in NMOS are preferably doped with $^{11}B^+$ in a concentration of $2\times10^{17}$ to $2\times10^{18}$ $cm^{-3}$. The impurity concentration of the highly doped regions are higher than that of the channel region in the substrate or in the well, preferably at least approximately twice as high as that in the channel region.

In the method of producing a surface-channel PMOS transistor according to the present invention, at the step (i), a gate dielectric film is formed on the semiconductor substrate and then a gate electrode is formed of the intrinsic polysilicon to a thickness of 100 to 200 nm. As the gate dielectric film, a material such as $SiO_2$ is formed to a desired thickness by a conventional process such as thermal oxidation and CVD method and/or by the $N_2O$ nitriding process (see IEEE ELECTRON DEVICE LETTERS Vol. 13, No. 2, February 1992, pp117 to 119).

The intrinsic polysilicon film has to be formed to a thickness of about 100 to 200 nm. It may be formed by a known method such as CVD method using silane gas. After the formation of the intrinsic polysilicon film, a gate electrode may be patterned into a desired configuration by a conventional photolithography and etching process.

At the step (ii), the gate electrode is doped with $^{11}B^+$ by implanting $^{11}B^+$ from the top of the gate electrode while simultaneously source/drain regions are formed in self-alignment with the gate electrode. For example, a region where a surface-channel PMOS transistor is to be formed is implanted with $^{11}B^+$ with an implant energy of 10 to 20 keV at a dose of $1\times10^{15}$ to $7\times10^{15}$ $cm^{-2}$ using the gate electrode and optionally a resist as a mask. In case where an NMOS transistor is formed, a gate electrode is firstly formed in a way similar to the above, to which $^{75}As^+$ with an implant energy of 40 to 100 keV at a dose of $1\times10^{15}$ to $7\times10^{15}$ $cm^{-2}$, or $^{31}P^+$ with an implant energy of 10 to 40 keV at a dose of $1\times10^{15}$ to $7\times10^{15}$ $cm^{-2}$ is doped, thereby simultaneously forming source/drain regions According to the present invention, after the above ion-implantation, the source/drain regions and gate electrode may optionally be annealed for activation. Preferably, this activation annealing is carried out in an atmosphere of argon, nitrogen or the like, at a temperature of about 750 to about 900° C. for about 10 to about 30 minutes when a furnace is employed, or at a temperature of about 900 to about 1000° C. for about 10 to about 30 seconds when a lamp annealer is employed. The furnace and lamp annealer may be used in combination.

According to the present invention, a silicide is optionally formed by depositing a refractory metal on the semiconductor substrate and/or polysilicon gate layer composing the source/drain regions and/or the gate electrode respectively. The formation of the silicide may be conducted by depositing a refractory metal on a semiconductor substrate having a polysilicon gate electrode by a conventional process, e.g., spattering and vaporization, then annealing the substrate for selective silicidation in a atmosphere of argon, nitrogen or the like at a temperature about 600 to about 700° C. for about 10 to about 30 seconds, and then removing unreacted refractory metal by wet etching. The annealing for the silicidation may be carried out independently of or in combination with the aforesaid activation annealing of the source/drain regions and gate electrode.

Preferably, before the formation of the source/drain regions in the above step (ii) according to the present invention, an amorphous layer is formed in a part or the whole of the gate electrode and the regions to be the source/drain regions by ion-implantation with $^{28}Si+$, $^{31}P^+$, $^{75}As^+$, $^{122}Sb^+$ or the like with an implant energy of about 20 to about 50 keV at a dose of about $3\times10^{14}$ to about $1\times10^{15}$ $cm^{-2}$. Especially in PMOS, the amorphous layer in the gate electrode and the regions to be the source/drain regions may inhibit the penetration of boron into the gate dielectric film and the channel region directly under the gate dielectric film which may be caused by boron channeling, and allows shallow source/drain regions.

Preferably after the formation of the gate electrode in step (i) according to the present invention, LDD regions are formed, and then a sidewall-spacer is formed on the side wall of the gate electrode. After the formation of the gate electrode, for example in PMOS, $^{11}B^+$ is implanted with an implant energy of 5 to 15 keV at a dose of $1\times10^{13}$ to $5\times10^{14}$ $cm^{-2}$, or $^{49}BF_2^+$ is implanted with an implant energy of 10 to 40 keV at a dose of $1\times10^{13}$ to $5\times10^{14}$ $cm^{-2}$, with the gate electrode as a mask separately from the ion-implantation for forming the source/drain regions in step (ii). Then, a sidewall-spacer is formed, for example, by depositing $Si_3N_4$ or $SiO_2$ of a thickness of about 30 to 250 nm on the semiconductor substrate having the gate electrode and then performing anisotropic etching such as RIE. In an NMOS transistor, LDD regions may be formed as described above except that, for example, As is implanted with an implant energy of 20 to 50 keV at a dose of $1\times10^{13}$ to $1\times10^{14}$ $cm^{-2}$.

Further, when the surface-channel MOS transistor of the present invention has the LDD regions, after the formation of the sidewall-spacer, it is preferred that highly doped regions of a different conductivity type from that of the source/drain regions are formed directly under the LDD regions and on the channel side of the source/drain regions by implanting ions at a large angle through the sidewall-spacer into the semiconductor substrate. In PMOS, the ion-implantation for the highly doped regions may be conducted with $^{75}As^+$ at an angle of 30 to 60° with respect to the normal line to the semiconductor substrate with an implant energy of 100 to 300 keV at a dose of $2\times10^{12}$ to $5\times10^{13}$ $cm^{-3}$, or with $^{31}P^+$ at an angle of 30 to 60° with respect to the normal line to the semiconductor substrate with an implant energy of 60 to 160 keV at a dose of $2\times10^{12}$ to $5\times10^{13}$ $cm^{-2}$. The ion-implantation with $^{75}As^+$ is more preferable since the diffusion coefficient and $\Delta Rp$ (implant diffusion) of $^{75}As^+$ are smaller than those of $^{31}P^+$. In NMOS, the ion-implantation for the highly doped regions may be conducted as described above except that, for example, $^{11}B^+$ is implanted with an implant energy of 50 to 150 keV at a dose of $2\times10^{12}$ to $5\times10^{13}$ $cm^{-2}$. The implant energy and angle in the large-angle ion-implantation must be such that the horizontal diffusion of the highly doped regions does not exceed the LDD regions and the vertical diffusion thereof does not exceed the source/drain regions. The large-angle ion-implantation may be carried out by equally dividing the total amount of ion to be implanted, e.g., into 4 to 8 parts, and rotating the semiconductor substrate by the angle obtained by dividing 360° by the number of the parts every time the part is implanted (called step implantation), or by implanting with rotating the semiconductor substrate at a regular speed (the rotary speed being less than 2 rps) (called rotational implantation). After the ion-implantation, the substrate may be optionally subjected to rapid heat-treatment such as lamp annealing or to furnace annealing at a lower temperature than the temperature for the activation of the source/drain regions. Preferably, this heat-treatment may be carried out in an atmosphere of argon, nitrogen or the like, at a temperature of about 750 to about 900° C. for 10 to 30 minutes when an furnace is employed, or at a temperature of about 900 to about 1000° C. for about 10 to about 30 seconds when a lamp annealer is employed. The furnace and lamp annealer may be used in combination.

Additionally, in the above formation of the highly doped regions, when $^{75}As^+$ is used for the ion-implantation, the characteristics of the device do not change much in whatever order the ion-implantation, activation annealing, silicide formation and the like are performed since the diffusion coefficient of $^{75}As^+$ is small. However, when $^{31}P^+$ or $^{11}B^+$ is used, the highly doped regions are preferably formed after the formation of the source/drain regions since the diffusion coefficients of $^{31}P^+$ and $^{11}B^+$ are large.

The surface-channel MOS transistor, CMOS and method of producing the same of the present invention will hereinafter be described in detail by way of embodiments thereof shown in the attached drawings. These embodiments are not intended to limit the scope of the invention.

Embodiment 1

FIG. 1 illustrates an embodiment of a dual-gate CMOS including NMOS transistor and PMOS transistor according to the present invention. The dual-gate CMOS is formed in a P-well 2 and an N-well 3 formed in a silicon substrate 1. Formed in P-well 2 is an NMOS transistor including a gate dielectric film 5, an $N^+$ polysilicon gate electrode 6a, a sidewall-spacer 9, silicide layers 12 and 12a, source/drain regions 10 and LDD regions 7, and formed in N-well 3 is a PMOS transistor including a gate dielectric film 5, a $P^+$ polysilicon gate electrode 6b, a sidewall-spacer 9, silicide layers 12 and 12a, source/drain regions 11 and LDD regions 8.

In the above NMOS and PMOS transistors, since both of $N^+$ polysilicon gate electrode 6a and $P^+$ polysilicon gate electrode 6b are formed to a thickness of 100 to 200 nm, the impurity concentration can be ensured at about $10^{20}$ $cm^{-3}$ or higher on the gate dielectric film sides of the polysilicon gate electrodes 6a and 6b even when the polysilicon gate electrodes 6a and 6b are doped in self-alignment simultaneously with the ion-implantation of the source/drain regions. Thereby, even when the implant energy for forming the source/drain regions 10 and 11 is low, the polysilicon gate electrodes 6a and 6b can be doped with impurity ion uniformly and sufficiently. Thus the depletion can hardly occur, the depth of the diffusion layer can be kept from increasing and the short-channel effects can be controlled. Especially in the NMOS transistor, even when As is used as implant ions for shallowing the source/drain junction because the implant range of As is short and the diffusion coefficient is small, the impurity concentration can be ensured to be high on the gate dielectric film side of the gate electrode 6a. Thus the generation of a depletion layer can be prevented in $N^+$ and $P^+$ polysilicon gate electrodes 6a and 6b. Therefore the field effect from the gate electrode 6a or 6b to the channel region does not become weak, which not only controls the short-channel effects but also allows good subthreshold characteristics and high driving ability. Additionally, even when the polysilicon gate electrodes 6a and 6b are formed to such a thickness as described above, the increase in gate resistance can be controlled due to the silicide layers 12a disposed on the gate electrodes.

By making amorphous not only the source/drain regions but also the polysilicon gate electrode 6b in self-alignment in the process of forming the $P^+$ source/drain regions 11 in the surface-channel PMOS, shallow source/drain regions can be formed by the later ion-implantation with $^{11}B^+$ with controlling channeling, and in addition the penetration of boron into the gate dielectric film and the channel region directly under the film can be prevented. The above effects are remarkable especially when the polysilicon gate electrode is made of columner crystal structure.

In this architecture of the present invention, since the penetration of boron can be inhibited by using $^{11}B^+$ instead of $^{49}BF_2^+$ for forming the $P^+$ source/drain regions, the thickness of the gate dielectric film is enough when it is more than 1.5 nm no matter which material the film is made of, conventional oxide film or nitrided oxide film of a low nitrogen concentration obtained using $N_2O$. Therefore it is not required to use a gate dielectric film which can cause a lot of electric traps such as nitrided oxide film obtained by using $NH_3$. Thus it has become easier to form a gate dielectric film of good characteristics. Besides, by using $^{11}B^+$, the penetration of boron can be inhibited even if the annealing is carried out at a high temperature for a long time for sufficiently recovering crystal defects in the step of forming the source/drain regions. Also in the silicidation, a lower resistance can be obtained by employing $^{11}B^+$ for implanting the P+ source/drain regions than by employing $^{49}BF_2^+$.

Embodiment 2

Figure 2:
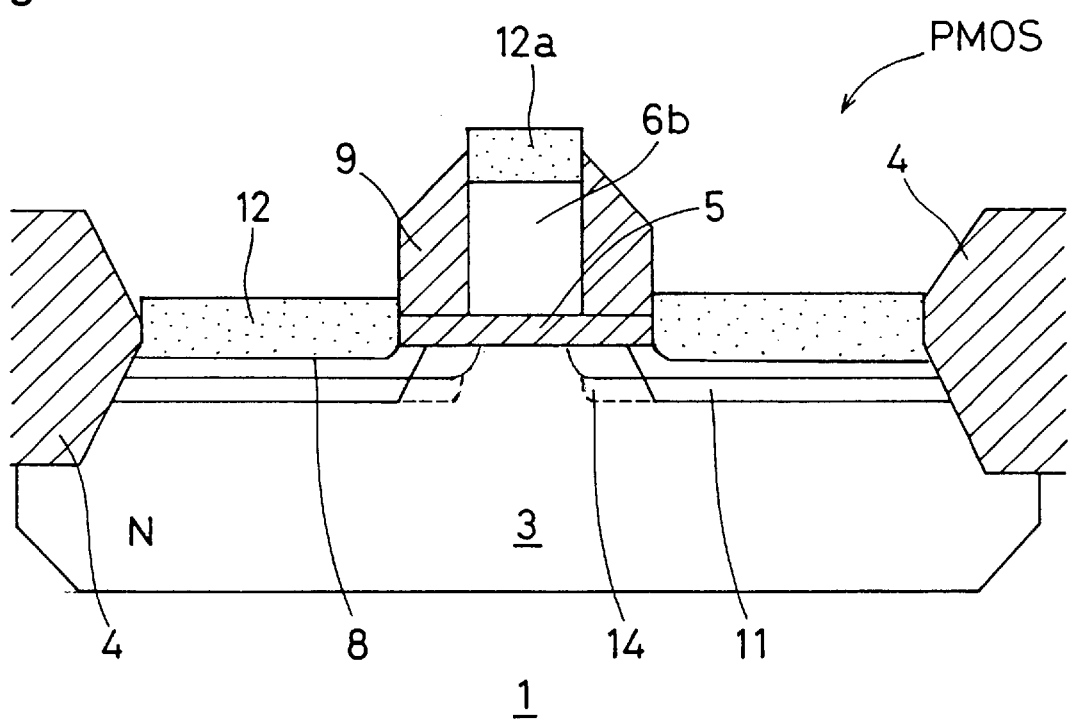
FIG. 2 is an enlarged schematic sectional view illustrating the essential part of another embodiment of a CMOS including a surface-channel PMOS transistor according to the present invention.

Referring to FIG. 2 which illustrates another embodiment of a dual-gate CMOS including NMOS transistor and PMOS transistor according to the present invention, the PMOS alone in the CMOS is shown in FIG. 2. The structure of the PMOS in FIG. 2 is the same as that of the dual-gate CMOS in Embodiment 1 except that N-type highly doped regions 14 of a higher concentration than that of N-well 3 are formed directly under the P-LDD regions 8 and on the channel side of P+ source/drain regions 11.

In such a device having highly doped regions of a conductivity type different from that of the source/drain regions, i.e., N-type highly doped regions 14, directly under the P−LDD regions 8 and on the sidewall of the channel side of the P+ source/drain regions 11, the extension of a depletion layer near the source/drain regions can be prevented without deterioration in the transfer conductance and subthreshold characteristics which can be caused by increased channel impurity concentration and without increase in the junction capacitance and junction leak current which can be caused by increased impurity concentration near the source/drain junction. Thus the short-channel effects can be controlled more effectively.

The method of producing the dual-gate CMOS will hereafter be explained.

Figure 3:
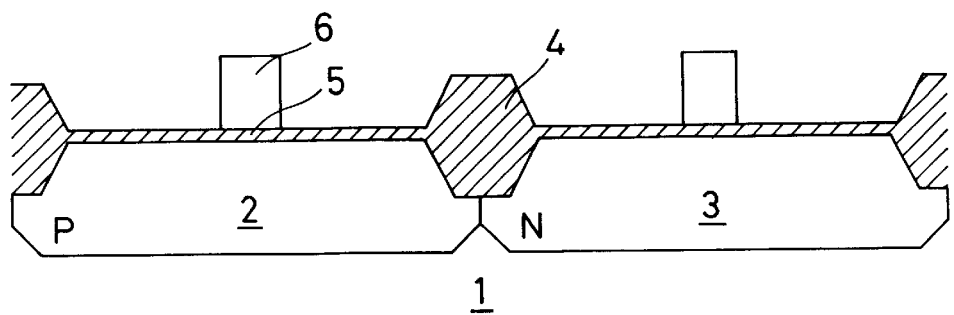
FIGS. 3 to 5 are schematic sectional views illustrating the essential part of CMOS in FIG. 2 in each production step.

First as shown in FIG. 3, a P-well 2 having impurities in a concentration of about $1\times10^{16}$ to $1\times10^{18}$ cm$^{-3}$, a N-well 3 having impurities in a concentration of about $1\times10^{16}$ to $1\times10^{18}$ cm$^{-3}$ and a field dielectric film 4 are formed on a silicon substrate 1 by a conventional process. Then a gate dielectric film 5 of a thickness of about 1.5 to 8 nm and an intrinsic polysilicon gate electrode 6 of a thickness of about 100 to 200 nm are formed. The gate dielectric film 5 can be an ordinary oxide film or a nitrided oxide film having a low nitrogen concentration obtained by using $N_2O$.

Figure 4:
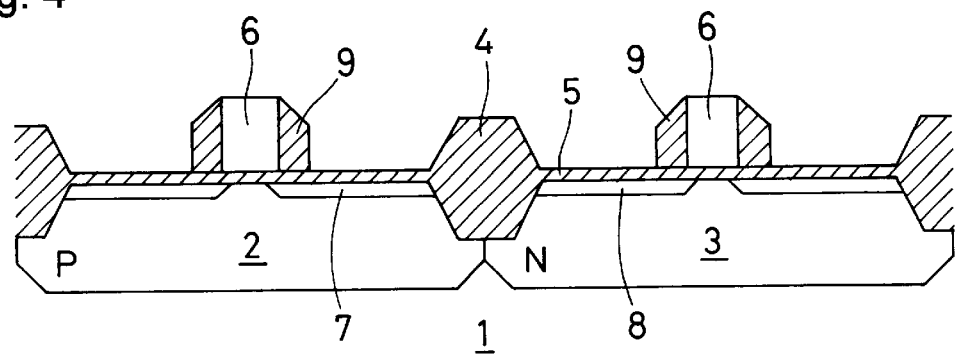

Next as shown in FIG. 4, a resist (not shown in the figure) is formed in a desired configuration to cover N-well 3 by lithography. Using the resist as a mask, N− LDD regions 7 having impurities in a concentration of about $1\times10^{18}$ to $5\times10^{19}$ cm$^{-3}$ is formed by doping $^{31}P^+$ with 10 to 30 keV at $10^{13}$ to $10^{14}$ cm$^{-2}$, or by doping $^{75}As^+$ with 20 to 50 keV at $10^{13}$ to $10^{14}$ cm$^{-2}$. Then, a resist (not shown in the figure) is formed in a desired configuration to cover P-well 2 by lithography. Using the resist as a mask, P− LDD regions 8 having impurities in a concentration of about $1\times10^{18}$ to $5\times10^{19}$ cm$^{-3}$ is formed by doping $^{49}BF_2^+$ with 10 to 40 keV at $1\times10^{13}$ to $5\times10^{14}$ cm$^{-2}$ or by doping $^{11}B+$ with 5 to 15 keV at $1\times10^{13}$ to $5\times10^{14}$ cm$^{-2}$. $SiO_2$ is then deposited to a thickness of 30 to 250 nm all over the silicon substrate 1 including the polysilicon gate electrode 6 by CVD process and a sidewall-spacer 9 is formed by anisotropic etching.

Figure 5:
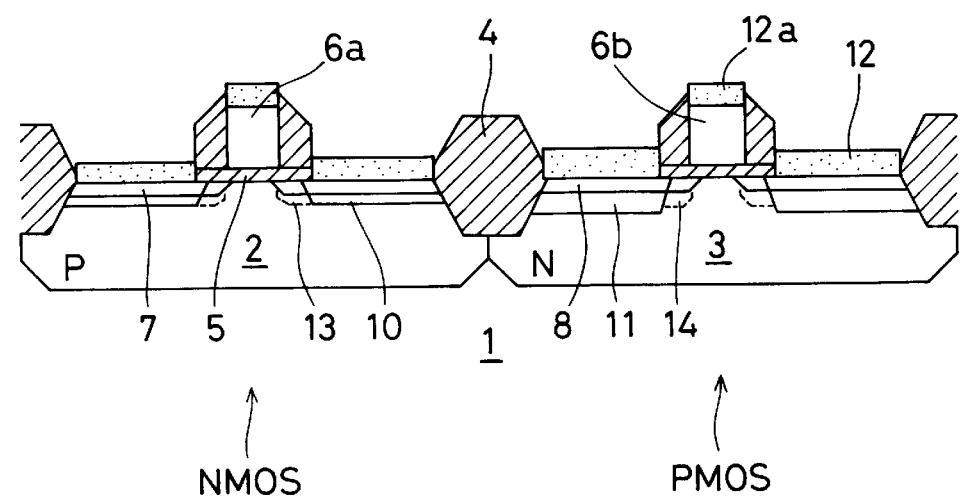
Figure 6:
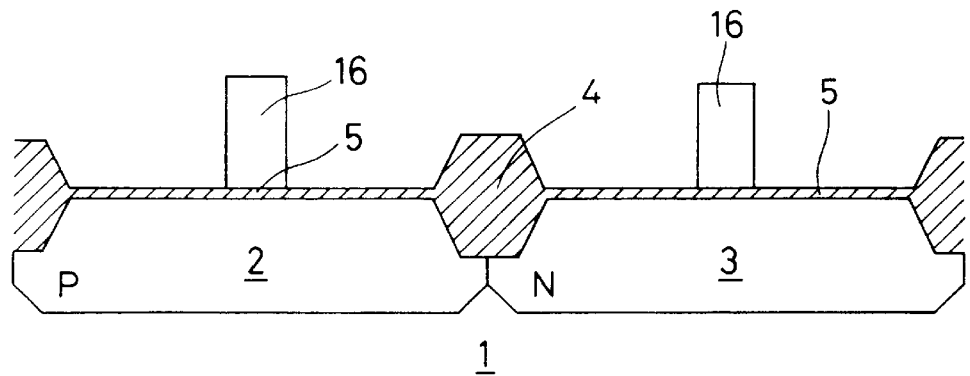
FIGS. 6 to 8 are schematic sectional views illustrating the essential part of a conventional CMOS in each production step.
Figure 7:
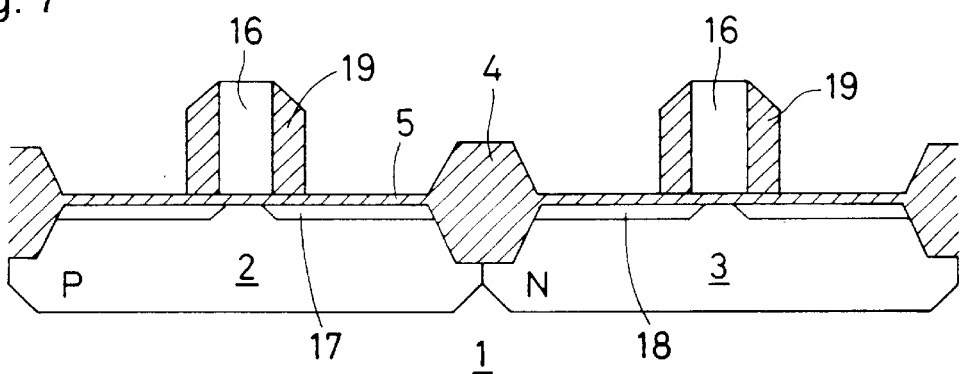
Figure 8:
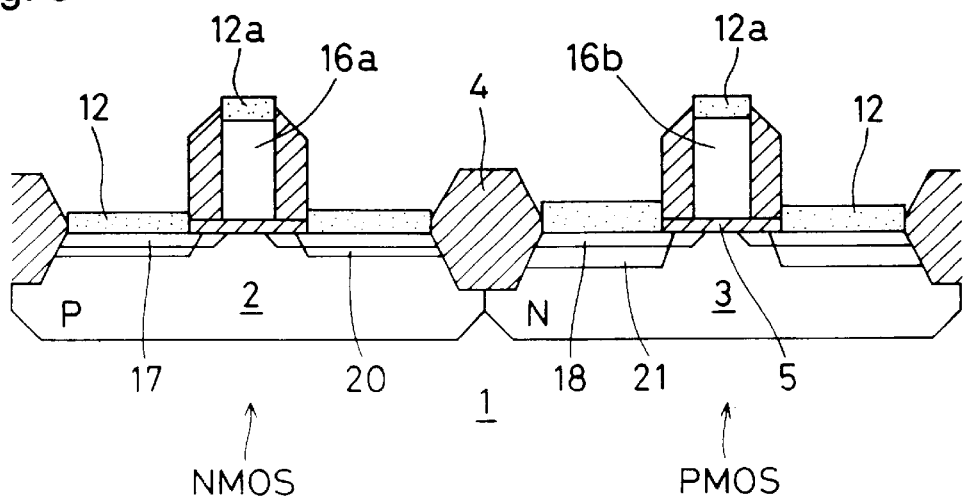
Figure 9:
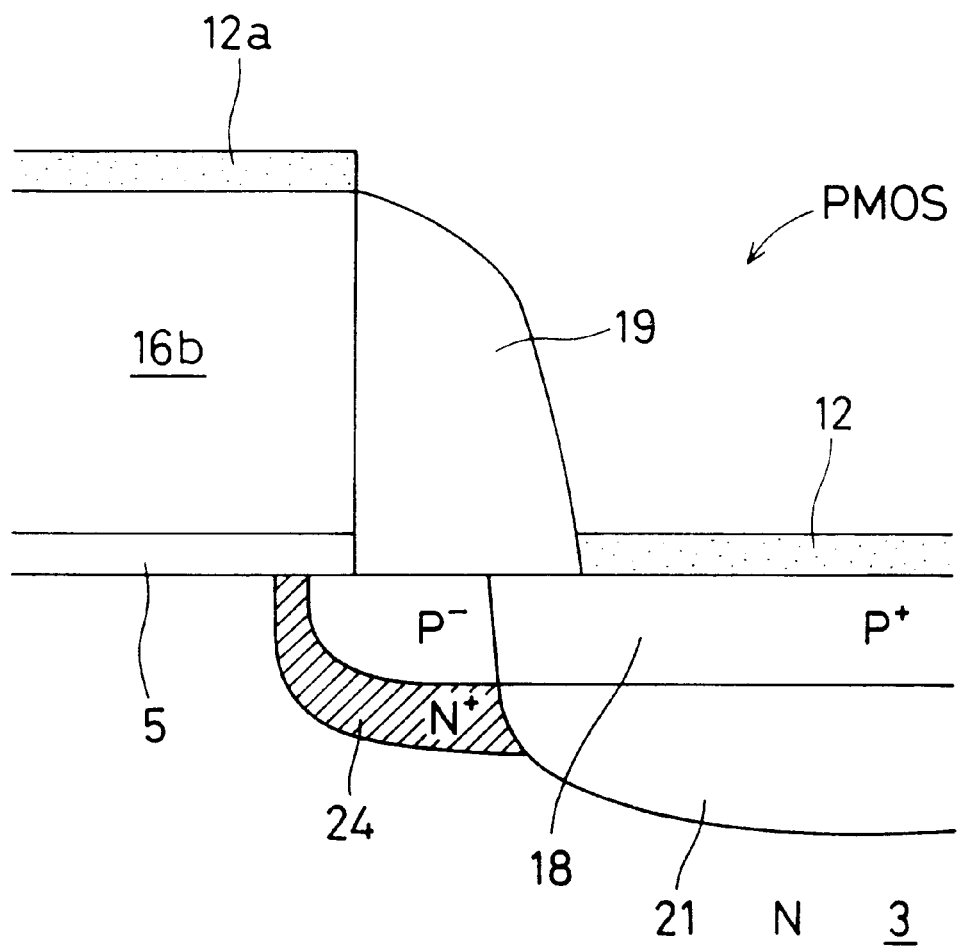
FIG. 9 is an enlarged schematic sectional view illustrating the essential part of a conventional CMOS.
Figure 10:
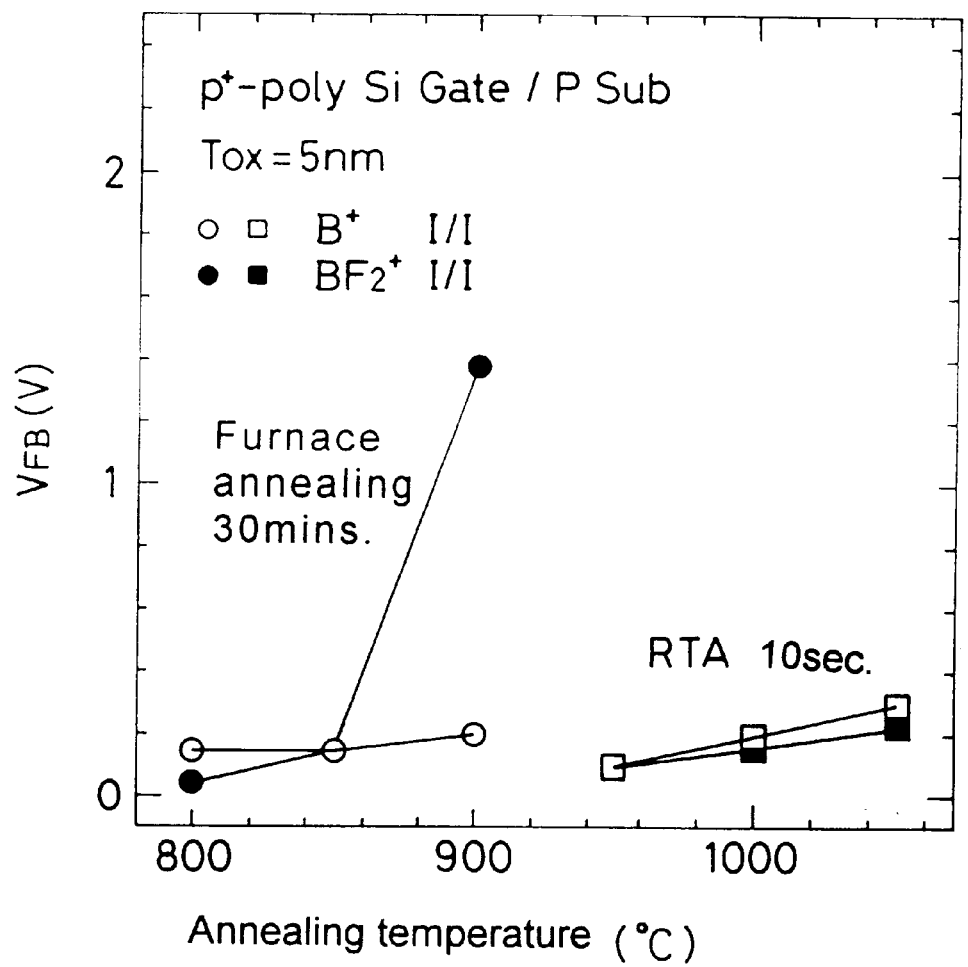
FIG. 10 is a graph showing relation between flat band voltage and annealing temperature when $^{11}B^+$ and $^{49}BF_2^+$ are implanted into the gate electrode as impurity ions.
Figure 11:
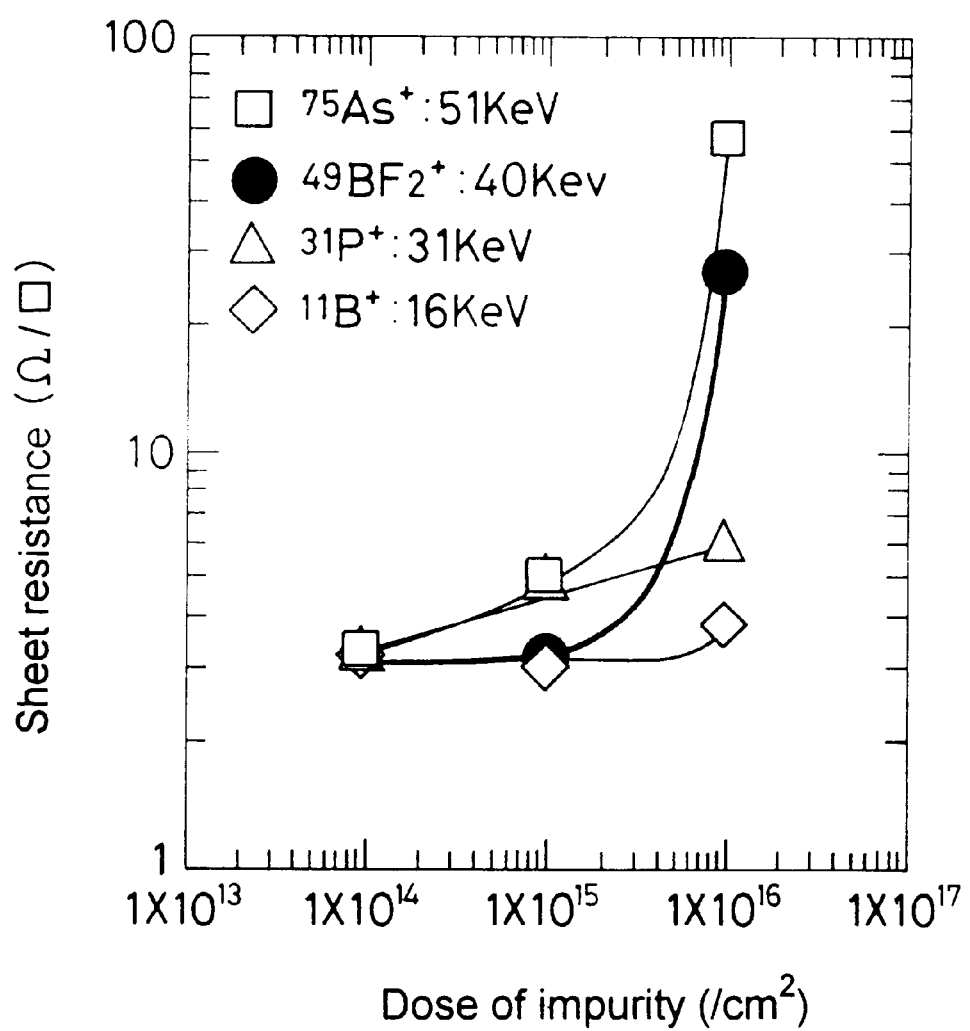
FIG. 11 is a graph showing relation between sheet resistance at a silicide and impurity concentration.

Further, as shown in FIG. 5, a resist (not shown in the figure) is formed in a desired configuration to cover N-well 3 by lithography. Using the resist, gate electrode 6 and sidewall-spacer 9 as a mask, an implantation of $^{75}As^+$ with 40 to 100 keV at $1\times10^{15}$ to $7\times10^{15}$ cm$^{-2}$ is conducted to dope it in the silicon gate electrode 6, thereby simultaneously forming N+ source/drain regions. Then, a resist (not shown in the figure) is formed in a desired configuration to cover P-well 2 by lithography. Using the resist, gate electrode 6 and sidewall-spacer 9 as a mask, an implantation of $^{28}Si^+$ or $^{31}P^+$ with 10 to 40 keV at $3\times10^{14}$ to $1\times10^{15}$ cm$^{-2}$ is conducted to make amorphous the polysilicon gate electrode 6, and then an implantation of $^{11}B^+$ with 5 to 20 keV at $1\times10^{15}$ to $7\times10^{15}$ cm$^{-2}$ is conducted to dope it in the silicon gate electrode 6, thereby simultaneously forming P+ source/drain regions 11. By making the gate electrode amorphous prior to the ion-implantation for forming P+ source/drain regions 11, the channeling of boron can be inhibited, shallow source/drain regions can be obtained and the gate dielectric film 5 and the channel region immediately thereunder can be protected against penetration of a large amount of boron. Therefore, the generation of fixed charge in the gate dielectric film, the deterioration of dielectric strength and the change of the channel impurity concentration can be controlled, thus the threshold voltage being stabilized. Particularly, these effects are remarkable when the polysilicon gate electrode 6 is made of columner crystal structure.

Then, the source/drain regions 10 and 11 and the polysilicon gate electrode 6a and 6b are annealed for activation depending on necessity. The annealing is preferably carried out in an inert gas atmosphere (e.g., argon or nitrogen) at a temperature of about 750 to about 900° C. for about 10 to about 30 minutes when a furnace is used, or at a temperature of about 900 to about 1000° C. for about 10 to about 30 seconds when a lamp annealer is used. The furnace and lamp annealer can be used in combination. Further, a refractory metal such as Ti is deposited to a thickness of about 10 to 50 nm by spattering or the like, subjected to heat treatment at about 600 to about 700° C. for about 10 to about 30 seconds for selective silicidation and unreacted refractory metal is removed by wet etching, thereby silicide layers 12 and 12a such as $TiSi_2$ being formed on the source/drain regions 10 an 11 and the gate electrodes 6a and 6b.

Further, P-type highly doped regions 13 and N-type highly doped regions 14 are formed directly under the LDD regions 7 and 8 in the NMOS and PMOS on the channel sides of the source/drain regions 10 and 11 in order to control short channel effects and, if necessary, heat treatment is carried out. For ion-implantation to form P-type highly doped regions 13, a resist (not shown in the figure) is formed in a desired configuration to cover the N-well 3 by lithography and then $^{11}B^+$ is doped at a dose of $2\times10^{12}$ to $5\times10^{13}$ cm$^{-2}$, with 50 to 150 keV at a large angle of 30 to 60° with respect to the normal line of the silicon substrate 1 depending on the thickness of the sidewall-spacer 9. For ion-implantation to form N-type highly doped regions 14, a resist (not shown in the figure) is formed in a desired configuration to cover the P-well 2 by lithography and then $^{31}P^+$ is doped at a dose of $2\times10^{12}$ to $5\times10^{13}$ cm$^{-2}$, with 60 to 160 keV at a large angle of 30 to 60° with respect to the normal line to the silicon substrate 1 depending on the thickness of the sidewall-spacer 9, or $^{75}As^+$ is doped at a dose of $2\times10^{12}$ to $5\times10^{13}$ cm$^{-2}$, with 100 to 300 keV at a large angle of 30 to 60° with respect to the normal line to the silicon substrate 1 depending on the thickness of the sidewall-spacer 9. The implant energy and angle in the large-angle-tilt implantation must be such that the horizontal extension of the highly doped regions do not exceed the LDD regions and the vertical extension of the highly doped regions do not exceed the source/drain regions.

In the above-described method, as the ion-implantation is executed at a large angle through the sidewall-spacer 9, the ion-penetration into the channel region is inhibited and the channel impurity concentration does not increase. Therefore, in both NMOS and PMOS, the highly doped regions 13 and 14 of the same conductivity type as the wells, which at least have higher impurity concentrations than the wells, can be formed directly under the LDD regions 7 and 8 on the channel sides of the source/drain regions 10 and 11 respectively. Thereby neither deterioration in the transfer conductance and subthreshold characteristics which can be caused by increased channel impurity concentration nor increase in the junction capacitance and junction leak current which can be caused by increased impurity concentration near the source/drain junction occurs. Further the extension of the depletion layers near the source/drain regions 10 and 11 is prevented. Thus the short-channel effects can be more effectively prevented than ever.

According to the surface-channel MOS transistor, the gate electrode disposed on the semiconductor substrate via the gate dielectric film is made of polysilicon of 100 to 200 nm in thickness almost uniformly doped with impurities. Therefore, in the NMOS of the present invention, the generation of the depletion layer on the gate dielectric film side of the gate electrode is controlled, thereby the short-channel effects are controlled and also good subthreshold characteristics and high driving ability can be obtained. In the NMOS, such effects are remarkable particularly when As is used for the doping of the source/drain regions and the gate electrode. Further in PMOS, since $^{11}B^+$ instead of $^{49}BF_2^+$ is used for ion-implantation of the source/drain regions and the gate electrode, the penetration of boron from the gate electrode into the semiconductor substrate is prevented, the generation of a depletion layer on the gate dielectric film side of the gate electrode is further controlled. Thereby the short-channel effects can be controlled and also good subthreshold characteristics and high driving ability can be obtained. Additionally, because the boron penetration is prevented, a conventional oxide film or nitrided oxide film obtained by using $N_2O$ can be used in a desired thickness as a gate dielectric film. Therefore there is no need any more to use a gate dielectric film which will cause a lot of electric traps such as a nitrogen oxide film obtained by using $NH_3$ and therefore a surface-channel PMOS transistor of good characteristics can be obtained. Further, the implantation of the $P^+$ source/drain with $^{11}B^+$ in the silicidation enables the resistance to be lowered compared with the case where $^{49}BF_2^+$ is used.

Further, when the device has highly doped regions of a different conductivity type from that of the source/drain regions directly under the LDD regions and on the channel side of the source/drain regions, the deterioration of the transfer conductance and subthreshold characteristics due to increase in the channel impurity concentration can be prevented, and also the extension of a depletion layer in the source/drain regions can be controlled without increase in the junction capacitance or junction leak current due to rise in the impurity concentration near the junction of the source/drain regions. Therefore, the short-channel effects can be controlled and a surface-channel MOS transistor having a high driving ability can be achieved.

Further in a CMOS transistor including NMOS and PMOS having the above-described surface-channel MOS transistor structure, since a polysilicon gate electrode of a thickness of 100 to 200 nm is used, the generation of a depletion layer can be controlled in both of NMOS and PMOS. The field effect from the gate electrode to the channel region is not therefore weakened. Thus a CMOS transistor can be obtained which has reliable, excellent device characteristics without short-channel effects. The prevention of a depletion layer from generating in the gate electrode by the present invention is remarkably noted in particular with NMOS where a material of a small diffusion coefficient such as As is used for implanting the polysilicon gate.

According to the method of producing a surface-channel MOS transistor of the present invention, (i) a gate dielectric film is formed on a semiconductor substrate, intrinsic polysilicon is deposited to a thickness of 100 to 200 nm on the dielectric film, and then a gate electrode is formed by a desired patterning; (ii) source/drain regions are formed in self-alignment with the gate electrode by ion-implantation while simultaneously the gate electrode is doped with the ion. Therefore, even in the case where the implant energy at the ion-implantation for forming the source/drain regions are lowered with a view to preventing the depth of the diffusion layer from increasing, the impurity concentration is secured at a desired concentration, e.g., $1\times10^{20}$ cm$^{-3}$, at the interface of the gate electrode with the gate dielectric film and a depletion layer in the gate electrode is hard to be generated. Accordingly, the field-effect from the gate electrode to the channel region is not weakened. Thus the short-channel effects are reduced, and good subthreshold characteristics and high driving ability are obtained.

Further, before the formation of the source/drain regions in the above (ii), an amorphous layer can be introduced in regions to be the source/drain regions by ion-implantation. In this case, in the later process of forming the source/drain regions and doping the gate electrode, channeling by ion-implantation, especially when $^{11}B^+$ is implanted, is prevented from occurring, so that shallow source/drain regions can be formed and penetration of boron into the gate dielectric film and the channel region directly under the gate dielectric film due to the channeling can be inhibited. Therefore, generation of a fixed charge in the gate dielectric film and change in the channel impurity concentration can be prevented.

Also, in the case where highly doped regions of a different conductivity from that of the source/drain regions are formed directly under LDD regions and on the channel side of the source/drain regions by large-angle-tilt ion-implantation, penetration of the ion into the channel region can be prevented by offset effects of a sidewall-spacer and the channel impurity concentration can be prevented from rising on the channel side of the LDD regions. Therefore, the short-channel effects can be reduced while the transfer conductance and subthreshold characteristics are maintained.

Further, in the large-angle-tilt ion-implantation, especially when $^{75}As^+$ is implanted at an angle of 30 to 60° with an implant energy of 100 to 300 keV at a dose of $2\times10^{12}$ to $5\times10^{13}$ cm$^{-2}$ or $^{31}P^+$ is implanted at an angle of 30 to 60° with an implant energy of 60 to 160 keV at a dose of $2\times10^{12}$ to $5\times10^{13}$ cm$^{-2}$, the impurity of the highly doped regions can be prevented from spreading widely and thereby it has become easier to design impurity profile, which contributes to improvement in device characteristics.

What is claimed is:

1. A surface-channel MOS transistor comprising:
   a gate electrode formed on a semiconductor substrate having a sidewall-spacer on the sidewall thereof;
   source/drain regions having lightly doped drain/source (LDD) regions; and
   highly doped regions of a different conductivity type from that of the source/drain regions formed directly under the LDD regions and on a side of the source/drain regions;
   wherein the horizontal extension of the highly doped regions toward the channel is smaller than the horizontal extension of the LDD regions and the vertical extension of the highly doped regions is shallower than the source/drain regions, wherein a boundary of each highly doped region at the channel side terminates approximately at or underneath the gate, wherein a boundary of each source/drain region at the channel terminates approximately at or underneath the sidewall spacer, and a boundary of each LDD region extends toward the channel beyond a boundary of the gate end, and wherein the impurity concentration of the highly doped regions is higher than that of the semiconductor substrate.

2. A complementary field-effect transistor (FET) which comprises a surface-channel MOS transistor of claim 1 as a PMOS transistor and a surface-channel MOS transistor of claim 1 as an NMOS transistor in combination on a semiconductor substrate.

3. A surface-channel MOS transistor according to claim 1, wherein the impurity concentration of the highly doped regions is at least twice as high as that of the channel region.

4. A surface-channel MOS transistor according to claim 1, wherein a boundary of each of the source/drain regions at the channel is not offset from the sidewall spacer.

* * * * *